United States Patent [19]

Maier et al.

[11] Patent Number: 4,858,057
[45] Date of Patent: Aug. 15, 1989

[54] MULTIPHASE TRIPPING DEVICE WITH SHORT-CIRCUIT DETECTION

[75] Inventors: Reinhard Maier, Herzogenaurach; Kurt Goth, Furth, both of Fed. Rep. of Germany

[73] Assignee: Siemens Aktiengesellschaft, Fed. Rep. of Germany

[21] Appl. No.: 240,411

[22] Filed: Aug. 31, 1988

[30] Foreign Application Priority Data

Aug. 4, 1986 [DE] Fed. Rep. of Germany ....... 3626398

[51] Int. Cl.⁴ .............................................. H02H 3/08
[52] U.S. Cl. ......................................... 361/94; 361/78
[58] Field of Search ...................... 361/22, 24, 28, 30, 361/31, 78, 79, 82-85, 87

[56] References Cited

U.S. PATENT DOCUMENTS

| | | | |
|---|---|---|---|
| 3,532,935 | 10/1970 | Waldron | 361/82 X |
| 3,697,811 | 10/1972 | Little | 361/82 |
| 3,984,737 | 10/1976 | Okamura et al. | 361/80 |
| 4,079,435 | 3/1978 | Zaslavskaya et al. | 361/68 X |
| 4,092,690 | 5/1978 | Wilkinson | 361/83 X |
| 4,100,587 | 7/1978 | Anderson et al. | 361/84 X |
| 4,218,718 | 8/1980 | Sun | 361/83 X |
| 4,296,451 | 10/1981 | Wilkinson | 361/83 X |
| 4,438,475 | 3/1984 | Haley | 361/84 X |
| 4,453,191 | 6/1984 | Wilkinson | 361/84 |
| 4,698,718 | 10/1987 | Chow et al. | 361/84 X |

FOREIGN PATENT DOCUMENTS

| | | |
|---|---|---|
| 1763527 | 4/1972 | Fed. Rep. of Germany . |
| 2539451 | 3/1977 | Fed. Rep. of Germany . |
| 2747575 | 4/1979 | Fed. Rep. of Germany . |
| 2818270 | 11/1979 | Fed. Rep. of Germany ........ 361/83 |

OTHER PUBLICATIONS

Siemens–Energie Technik 2(1980) Hett12,499–502; Preuss & Schmelcher: Electronische Uberstromausloser FR Niederspannungsleistung Sschalter 3WE.

Primary Examiner—M. H. Paschall
Assistant Examiner—A. Jonathan Wysocki
Attorney, Agent, or Firm—Kenyon & Kenyon

[57] ABSTRACT

The invention relates to a device for picking-up voltage and for comparing the instantaneous powers of the individual phases with each other, the output of which is in functional connection with the tripping command transmitter in the event of a predetermined deviation.

5 Claims, 1 Drawing Sheet

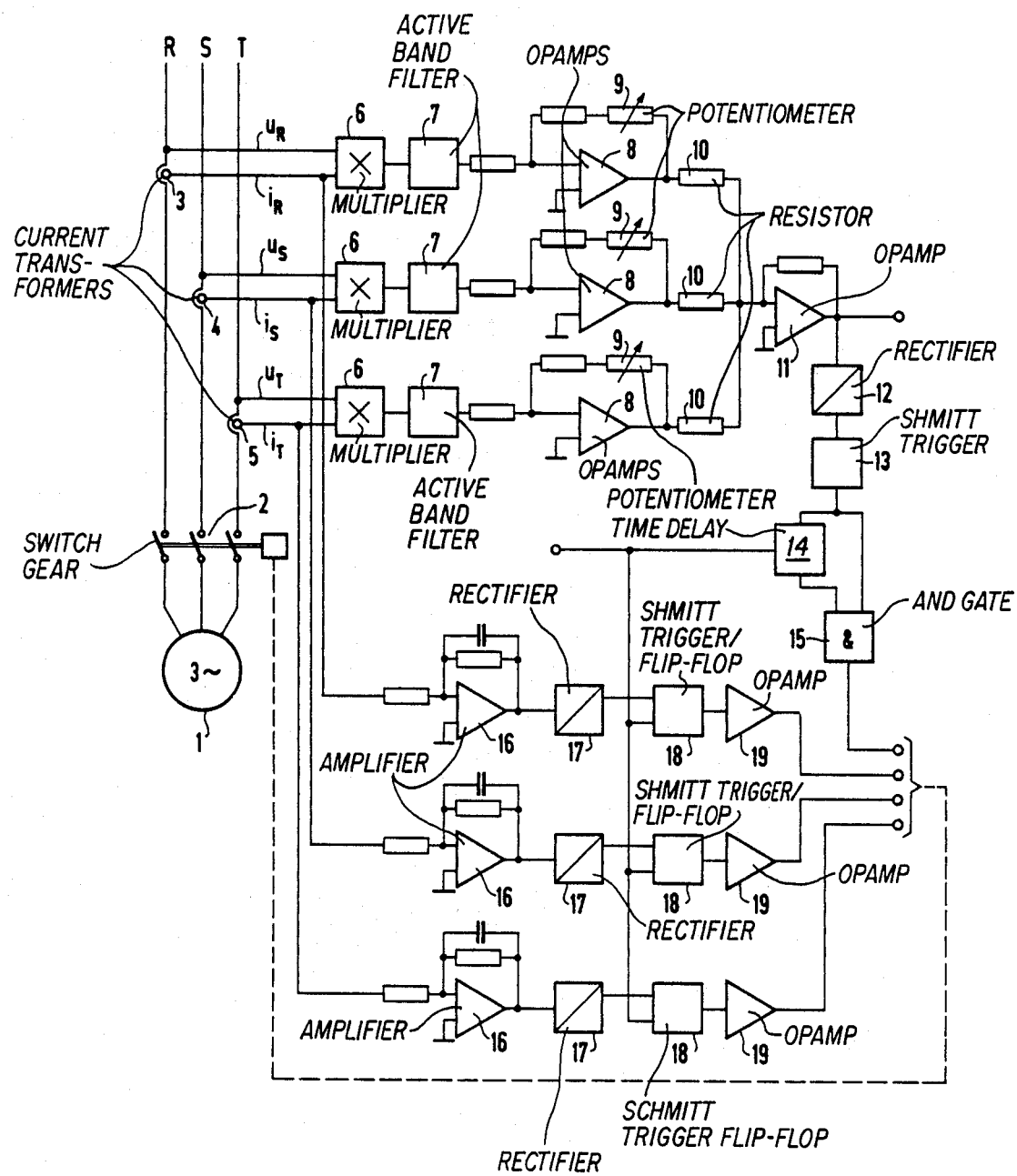

MULTIPHASE TRIPPING DEVICE WITH SHORT-CIRCUIT DETECTION

This application is a continuation, of application Ser. No. 074,285, filed 7-16-87, now abandoned.

BACKGROUND OF THE INVENTION a. Field of Invention

The invention relates to an electronic overcurrent tripping device for multi-phase circuit breakers with a short circuit current detector, a comparison circuit as well as a tripping command transmitter.

b. Description of the Prior Art

In reverse-power relays it is known (U.S. Pat. No. 4,100,587) to sum up the instantaneous power values. The sum of the instantaneous powers is fed to a lowpass filter in which the a-c components are filtered out so that the active powers of the three phases are added. The result is fed to a comparator, in which the sum is compared with a fixed, set reference value.

An electronic overcurrent tripping device for the detection of overcurrents and short circuits and the tripping of a circuit breaker is described in Siemens Energie-Technik 2 (1980), No. 12, pages 499 to 502.

SUMMARY OF THE INVENTION

It is an object of the invention to improve the overcurrent tripping device described in the above-mentioned Siemens publication in such a manner that shorted winding in motors are detected and, in response a circuit breaker is tripped. This is achieved in a simple manner by the provision of multipliers in which the products of instantaneous phase current and voltage values are formed to obtain the instantaneous powers of the individual phases. The products are summed and the sum is used for a tripping transmitter in the event of a predetermined deviation. The summation is preceded by a filter arrangement such as a band filter, with a central passing frequency of twice the grid frequency.

In the subject invention, the active power components are filtered out ahead of the summation so that the a-c components are available as a sum for forming a tripping criterion for shorted turns that have occurred. In the steady state, the signal delivered by the multiplier circuit is a sinusoidal with a DC component indicative of the active power and with twice the grid frequency. Instantaneous waveforms caused by load changes faults may have other frequencies. Providing a filter arrangement insures that the circuit according to the invention can be addressed in its working range. Symmetrizing elements are interposed in the individual phases between the filter arrangement and the rectifier circuit, to compensate for differences in the phases of the unfaulted motor. It is furthermore advantageous if the symmetrizing elements take into consideration asymmetries existing on the load side of the device. The sumation element adds the individual instantaneous powers and thus makes possible the detection of motor defects. Since the contacts of the switch do not close completely simultaneously when the motor is switched on, false pulses could occur. In order to avoid this, it is advantageous to use a Schmitt trigger circuit followed by a time delay circuit, and an AND gate a second input of which is connected to the output of the Schmitt trigger. This has the effect that the circuit becomes effective only about 1 second after the motor is switched on. During this time, however, the current level monitor is effective. This delay appears to be acceptable since a motor with a complete motor protection device can be tested for shorted turns before it is switched on. A simple design for the short circuit current monitoring is obtained if the short circuits are processed by an integrating amplifier as a lowpass filter which is followed by a rectifier circuit, a Schmitt trigger as well as a flipflop connected to the tripping command transmitter.

BRIEF DESCRIPTION OF THE DRAWING

The FIGURE shows a preferred embodiment of an overcurrent tripping device constructed in accordance with the invention.

DESCRIPTION OF THE PREFERRED EMBODIMENT

The circuit for the electronic overcurrent tripping device shown in the drawing is used for controlling a motor connected to a 3-phase grid RST via the switchgear 2. Current transformers 3, 4, 5 are used for sensing the current through the grid lines signals corresponding to the current IR, IS, IT. The transformer outputs, as well as the voltages UR, US, UT are fed to multiplier circuits 6, which in response generate signals corresponding to the instantaneous powers delivered by of the individual phases. In the steady state condition, these signals have a sinusoidal wave form with a DC component corresponding to the active power, and a frequency equal to twice the grid frequency. Changes in the load or short circuits can cause signals with frequencies other than zero or twice the grid frequency during such state changes, the content of the transient can become so large that the operative range of the subject circuit can be exceeded. Therefore, the signals from the multipliers are fed respectively to fourth-order active band filters 7, the center (passing) frequency of which is set at twice the grid frequency. The symmetrizing members 8 connected to these filters are feed-back operational amplifiers, having potentiometers 9 in the feedback path. Differences in the phase powers of the unfaulted motor and grid asymmetries can be compensated by adjustment of the potentiometers 9. The individual powers are summed through resistors 10, and the sum is applied to a further operational amplifier 11. The resultant voltage from the amplifier 11 may be output as shown. In addition, rectifier 12 is connected to the amplifier output to determine the mean value of the amplifier signal. The mean value is fed to a Schmitt trigger circuit 13 which determines when the mean value of the amplifier output exceeds a present threshold level.

In measurements with shorted turns caused by taps at the motor winding it has been found that even with several shorted turns the amplitudes of currents and voltages have very small differences. However, the phase shifts between currents and voltages change greatly. Under these conditions it can be calculated that the output signal of the circuit is proportional to 2 UI sin (A4/2), where by A4 the phase difference of the winding with shorted turns to the windings without shorted turns is. The evaluation circuit is therefore very phase-sensitive. The phase sensitivity is necessary especially in the case of shorted turns which result, as previously mentioned in currents with nominal values. The evaluation method should indicate, if possible, only one shorted turn. All normal operating states should not be affected here.

A change from a no-load to full-load causes no substantial changes of the total signal resulting from the addition of the phase power signals although the instantaneous powers of the individual phases become substantially larger. This, however, is not the case when the motor is initially switched on. The reason for this is that the contacts of the switch do not close completely simultaneously and the transient behavior of the three-phase windings is not identical. In order to compensate for this effect, the signal coming from the Schmitt trigger 13 is therefore fed to a time delay circuit 14 the output of which is connected to an AND gate 15. A second input of the AND gate is connected to the output of the Schmitt trigger circuit 13. From the AND gate 15, a tripping signal is sent to the switchgear 2 if both conditions are met thereby opening the switchgear. For picking-up short circuits serve, as is well-known, integrating amplifiers 16 connected to the current transformers 3 to 5 as a lowpass filter which are connected via rectifiers 17 to a Schmitt trigger and flip-flop circuit 18, and act on operational amplifiers 19. The output of the operational amplifiers again are put to the tripping of the switchgear 2.

If a shorted turn occurs, the output signal has reached its final value not more than 10 milliseconds later. The reason for this high speed is the lack of, for instance, integrating elements such as are used for the determination of r.m.s. values or the like. The only delayed element in the formation of the shorted-turn signal is the bandpass 7 which follows the state change with a delay of 10 milliseconds.

Obviously, numerous modifications may be made to this invention without departing from its scope as defined in the appended claims.

What is claimed is:

1. An electronic overcurrent tripping device which senses short circuit current in a multiphase grid with a grid frequency, comprising:

means for sensing an instantaneous current and an instantaneous voltage in each phase;

means for multiplying each instantaneous current and voltage for obtaining an instantaneous power for each phase;

means for filtering out all dc components of said instantaneous powers, having a passing frequency of twice said grid frequency to generate filtered signals;

a summing circuit, coupled to said means for filtering, which sums the filtered signals to generate a summing output signal;

a comparison circuit, coupled to said summing circuit, which determines when a deviation of said summing output signal exceeds a predetermined threshold level; and a tripping command transmitter coupled to said comparison circuit and activated by said summing output signal when said summing output signal deviation exceeds said predetermined threshold level.

2. The overcurrent tripping device according to claim 1, further comprising a rectifier circuit coupled to said comparison circuit, and a symmetrizing members coupled between said means for filtering and said rectifier circuit.

3. The overcurrent tripping device according to claim 2, wherein said symmetrizing members include means for compensating assymmetries on a feeding side of said multiphase grid.

4. The overcurrent tripping device according to claim 1, wherein said comparison circuit includes a Schmitt trigger circuit and said tripping comand transmitter includes a time delay circuit and an AND gate which are both coupled to an output of said Schmitt trigger circuit.

5. The overcurrent tripping device according to claim 1, further comprising an integrating amplifier acting as a lowpass filter means for processing short circuits, a rectifier circuit coupled to said amplifier, and a Schmitt trigger and flip-flop coupled to said tripping command transmitter.

* * * * *